United States Patent
Nakatsu et al.

(10) Patent No.: US 7,206,204 B2
(45) Date of Patent: Apr. 17, 2007

(54) ELECTRIC CIRCUIT MODULE

(75) Inventors: Kinya Nakatsu, Hitachinaka (JP);
Naoki Takata, Narashino (JP);
Masayuki Hirota, Narashino (JP);
Satoshi Ibori, Yachimata (JP); Tomoya Kamezawa, Narashino (JP)

(73) Assignee: Hitachi Industrial Equipment Systems Co., Ltd., Chiba (JP)

( * ) Notice: Subject to any disclaimer, the term of this patent is extended or adjusted under 35 U.S.C. 154(b) by 0 days.

(21) Appl. No.: 11/011,085

(22) Filed: Dec. 15, 2004

(65) Prior Publication Data

US 2005/0135065 A1 Jun. 23, 2005

(30) Foreign Application Priority Data

Dec. 19, 2003 (JP) ............................. 2003-421787

(51) Int. Cl.
*H05K 7/20* (2006.01)
(52) U.S. Cl. .................. 361/703; 361/704; 257/718; 165/80.3
(58) Field of Classification Search ........ 361/702–710, 361/688, 690, 715–719, 722–723, 802, 807, 361/803, 725–729; 257/713, 715, 718–719, 257/675, 796; 165/80.2, 80.4, 80.3, 185; 174/15.1, 15.2, 16.3, 252; 24/295, 458, 573, 24/625, 292, 293
See application file for complete search history.

(56) References Cited

U.S. PATENT DOCUMENTS 5,834,842 A * 11/1998 Majumdar et al. ......... 257/718

6,266,244 B1 * 7/2001 Guthrie ...................... 361/704
6,431,259 B2 * 8/2002 Hellbruck et al. .......... 165/80.3
6,477,053 B1 * 11/2002 Zeidan et al. ............... 361/719
6,979,204 B2 * 12/2005 Gobl et al. .................. 439/73

FOREIGN PATENT DOCUMENTS

| JP | U-62-47140 | 3/1987 |
| JP | Y2-6-22995 | 6/1994 |
| JP | Y2-7-3674 | 1/1995 |
| JP | A-9-134985 | 5/1997 |
| JP | A-2001-332670 | 11/2001 |
| JP | A-2002-198477 | 7/2002 |
| JP | 2003347783 A * | 12/2003 |

* cited by examiner

*Primary Examiner*—Michael Datskovskiy
(74) *Attorney, Agent, or Firm*—McDermott Will & Emery LLP

(57) ABSTRACT

An electric circuit module comprising: an electric device comprising an electric circuit to serve for passage and interruption of electric current, a packing material packing the electric circuit and a plurality of wiring members to electrically connect the electric circuit with an external circuit; and a heat sink to radiate heat from the electric device. The electric circuit module includes a fixture to fix the heat sink and the electric device together so that a heat radiating surface of the electric device comes into contact with the heat sink. The fixture is formed with a recess to accommodate therein a part of the electric device so that the heat radiating surface of the electric device is exposed from the fixture. When the electric device is fixed to the heat sink by the fixture, the heat radiating surface comes into contact with the heat sink.

20 Claims, 14 Drawing Sheets

ELECTRIC CIRCUIT MODULE

BACKGROUND OF THE INVENTION

The present invention relates to an electric circuit module in which an electric device is mounted on a heat sink.

An electric device, for example, a power semiconductor, is fixed to a copper plate by solder and the electric device together with lead wires for connection to an external circuit is encapsulated by a resin packing material, which is typified by epoxy resins, in a transfer molding method. Power semiconductors generate heat when applying electric current. The generated heat is dissipated to the outside through the copper plate or the packing material. Such a conventional power semiconductor constructed in this manner is mounted on a heat sink as shown in FIG. 32. More specifically, a screw is inserted through a through-hole provided on the packing material, and the screw is threadedly attached to the heat sink whereby the power semiconductor is fixed to the heat sink. Thereby, the power semiconductor is pressed against the heat sink and heat generated therefrom is efficiently transmitted to the heat sink.

Also, JP-Y2-7-3674, JP-A-2002-198477, JP-U-62-47140, JP-Y2-6-22995, JP-A-2001-332670, and JP-A-9-134985 disclose methods of mounting an electric device, which are known as conventional methods.

With an electric device, disclosed in JP-Y2-7-3674, among these, insulating holding means is provided inside a plurality of openings, which accommodate therein a plurality of electronic parts whereby the plurality of electronic parts are pressed against and fixed to a heat sink. Also, with the electric device disclosed in JP-Y2-7-3674, through-holes for permitting lead wires of the electronic parts to extend therethrough are provided in an electronic-part accommodating body whereby locating of the plurality of electronic parts are performed.

With a semiconductor device disclosed in JP-A-2002-198477, there is provided a plate-shaped elastic body, which is fixed to a heat sink by a screw and bent to cover power semiconductors, and a compressive force of which a power semiconductor is pressed against and fixed to the heat sink. Also, with the semiconductor device disclosed in JP-A-2002-198477, a positioning member is provided on a portion of the elastic body whereby locating of the lead wires of the power semiconductor is performed.

With a mount construction of a transistor disclosed in JP-U-62-47140, a power semiconductor is pressed against and fixed to a heat sink by a mount cover, which is made of an insulating material and provided with a power-semiconductor locating projection, a positional shift restricting portion, and an engaging portion for the heat sink.

With a fixing construction of a semiconductor element disclosed in JP-Y2-6-22995, a holding metal fitting is provided with a first projection, which is inserted into a hole provided in a packing material of a power semiconductor and by which the power semiconductor is pressed against and fixed to a heat sink.

Also, with the transistor mounting construction disclosed in JP-U-62-47140, a second projection is provided to press a packing material against the heat sink.

With a packaging construction of a semiconductor device disclosed in JP-A-2001-332670, a power semiconductor is pressed against and fixed to a heat sink by a plate-shaped spring member fixed to the heat sink. A heat insulating material having an insulating property is provided on an opposite surface of the plate-shaped spring member to a surface thereof in contact with the power semiconductor whereby the power semiconductor is hidden.

With a packaged construction of a semiconductor device disclosed in JP-A-9-134985, a plate-shaped spring is provided in a recess, which accommodates therein a power semiconductor, whereby the power semiconductor is fixed to a heat sink. Also, a projection fitted into the power semiconductor is provided in the recess whereby supporting of and prevention of coming-off of the power semiconductor are achieved.

With the screwing configuration in the conventional packaging construction shown in FIG. 32, however, the resin packing material causes a difference between a pressing force in a position just below the screw and a pressing force in a position distant from the position just below the screw, and deformation of the packing material. Therefore, with the screwing configuration in the conventional packaging construction shown in FIG. 32, it is not possible to obtain an efficient and stable heat dissipating quality (heat resistance). Also, the assembling quality is degraded by a decrease in accuracy to locate the lead wires.

With the construction disclosed in JP-Y2-7-3674, a spring provided in the opening of the electronic-part accommodating body generates an elastic force in an operating portion with a base of the spring in the electronic-part accommodating body as a fulcrum, so that creep fatigue is believed to be resulted in the spring. Creep fatigue appears markedly at high temperatures. Therefore, with the construction disclosed in JP-Y2-7-3674, it is believed that the material of the spring deteriorates to cause a decrease in pressing force and a stable heat dissipating quality cannot be obtained. Also, with the construction disclosed in JP-Y2-7-3674, the lead wires are believed to be unnecessarily bent upon insertion. Therefore, with the construction disclosed in JP-Y2-7-3674, the assembling quality is believed to be degraded.

With the construction disclosed in JP-A-2002-198477, the lead wires are believed to be unnecessarily bent upon insertion. Therefore, with the construction disclosed in JP-A-2002-198477, the assembling quality is believed to be degraded. Also, with the construction disclosed in JP-A-2002-198477, since a plurality of power semiconductors are assembled to the heat sink by the one elastic body, it is believed that the power semiconductors may come off and the positional accuracy may be lowered.

With the construction disclosed in JP-U-62-47140, it is believed that when a plurality of power semiconductors are to be fixed to the same heat sink, a pressing force cannot be applied evenly to the respective power semiconductors. Also, with the construction disclosed in JP-U-62-47140, it is not believed that it is possible to obtain an efficient and stable heat radiating quality (heat resistance).

With the construction disclosed in JP-Y2-6-22995, since only one positioning mechanism is prepared for the holding metal fittings and the power semiconductor, it is believed that turning is caused about the hole provided on the packing material of the power semiconductor. Therefore, with the construction disclosed in JP-Y2-6-22995, it is believed that that accuracy, with which the lead wires are positioned, is degraded and the assembling quality is degraded.

With the construction disclosed in JP-A-2001-332670, since the spring material is thin and an area, in which the spring material is connected to the heat sink, is small, it is believed difficult to radiate heat from the spring member and the insulating material. Therefore, with the construction disclosed in JP-A-2001-332670, temperature rise is believed to become conspicuous in the insulating material just above a portion of the spring member in contact with the power semiconductor.

With the construction disclosed in JP-A-9-134985, there is a need of individually preparing and fixing the plate-shaped springs, respectively, in the respective recesses, which accommodate therein the respective power semiconductors, so that the number of parts and assembly processes are increased and it is not believed that cost can be reduced.

SUMMARY OF THE INVENTION

The invention provides an electric circuit module capable of stabilizing heat resistance between a heat sink and an electric device and improving the heat radiating performance of the electric device. Also, the invention provides an electric circuit module capable of heightening the positional accuracy of an electric device and lead wires, which project from the electric device, and improving the assembling quality. Further, the invention provides an inexpensive electric circuit module capable of preventing coming-off of an electric device at the time of assembly.

The invention has a feature in the provision of a fixture fixed to a heat sink to thereby act to have an electric device projecting outside the fixture from a recess of the fixture and to press a heat radiating surface of the electric device against a surface of the heat sink.

Also, the invention has a feature in the provision of a recess to accommodate therein an electric device such that at least a heat radiating surface of the electric device is exposed outside.

Further, the invention has a feature in the provision of a member to prevent coming-off of an electric device from a fixture.

According to the invention, it is possible to stabilize heat resistance between a heat sink and an electric device and to improve the heat radiating performance of the electric device. Also, according to the invention, it is possible to heighten the positional accuracy of an electric device and lead wires, which project from the electric device, and to improve the assembling quality. Further, according to the invention, it is possible to prevent coming-off of an electric device at the time of assembly.

A typical best mode for carrying out the invention is as follows.

That is, the best mode resides in an electric circuit module comprising an electric device, a heat sink to radiate heat generated from the electric device, and a fixture to fix the electric device to the heat sink, and wherein the electric device comprises an electric circuit, which serves for passage and interruption of electric current and is packed by a packing material, a plurality of wiring members electrically connected to the electric circuit are taken outside from an interior of the packing material, a surface of the packing material is provided with a heat radiating surface, which comes into surface contact with a surface of the heat sink, the fixture is fixed to the heat sink to fix the electric device to the heat sink such that a heat radiating surface thereof and the surface of the heat sink come into surface contact with each other, and is formed with a recess to accommodate therein the electric device with at least the heat radiating surface thereof exposed outside, and the fixture is fixed to the heat sink and the fixture acts to have the electric device projecting outside the fixture from the recess whereby the heat radiating surface is pressed against the surface of the heat sink.

Other objects, features and advantages of the invention will become apparent from the following description of the embodiments of the invention taken in conjunction with the accompanying drawings.

DESCRIPTION OF THE PREFERRED EMBODIMENTS

Embodiments of the invention will be described hereinafter with reference to the drawings.

Figure 1:
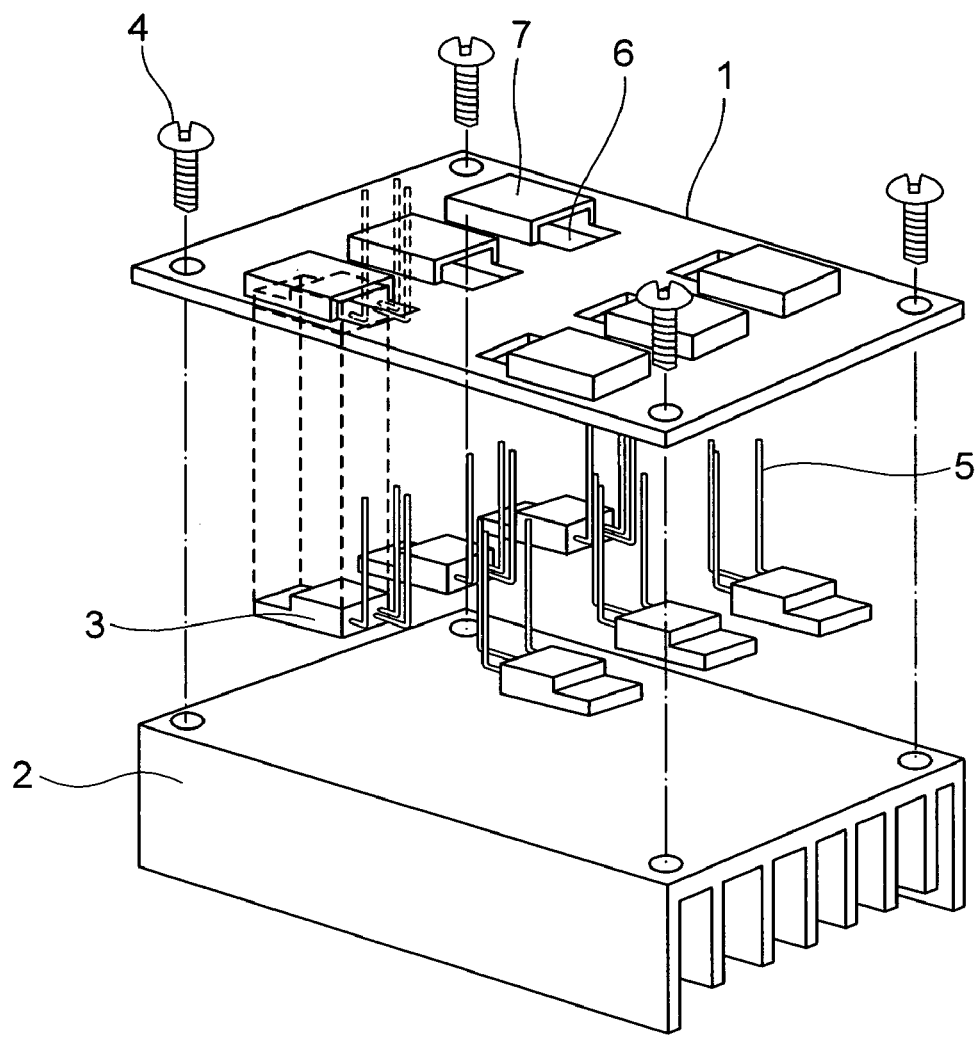
FIG. 1 is a view showing a schematic configuration of a packaged construction of an embodiment of an electric circuit module according to the invention.
Figure 2:
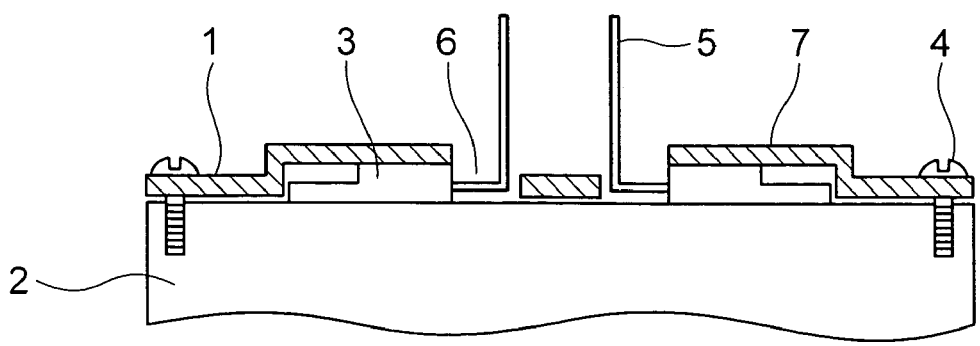
FIG. 2 is a cross sectional view showing the configuration of FIG. 1.

FIGS. 1 and 2 show a schematic configuration of a packaged construction of a 1st embodiment of an electric circuit module of the invention. A heat sink 2 shown in FIGS. 1 and 2 comprises a metal base formed of a material, such as copper, aluminum, etc., having an excellent thermal conductivity by means of molding or cutting. A plurality of fins are provided on a surface opposed to a mounting surface on which an electric device described later is mounted. The mounting surface of the heat sink 2 is provided at four corners thereof with threaded holes, into which clamp screws 4 are screwed. The clamp screws 4 are screwed into the threaded holes whereby a fixture 1 is fixed to the heat sink 2.

The fixture 1 is formed by using a metallic die to mold a resin or metal. In particular, inorganic powder filler typified by glass or silica is preferably mixed in the resin to enhance the strength and heat resistance. A plurality of recesses 7 are provided centrally of the fixture 1. The recesses 7 are aligned three along short sides of the fixture 1. Further, the recesses 7 aligned three are aligned two along long sides of the fixture 1. The recesses 7 comprise a depression, which accommodates an electric device in a manner to expose at least a heat radiating surface of the electric device exposed from an opened area thereof and which is shaped to follow an external form of the electric device. The fixture 1 is also a member to cover the whole mounting surface of the heat sink 2 or to cover the mounting surface so as to leave a peripheral portion of the mounting surface of the heat sink 2.

Figure 31:
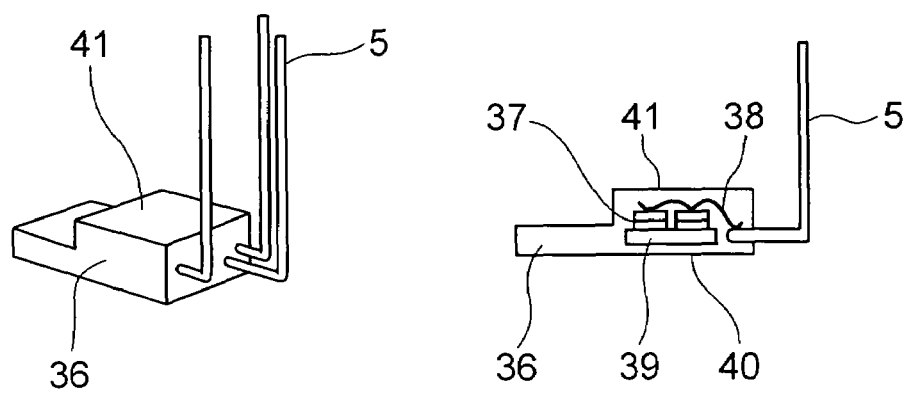
FIG. 31 is a view showing a construction of an electric device typified by a power semiconductor.
Figure 32:
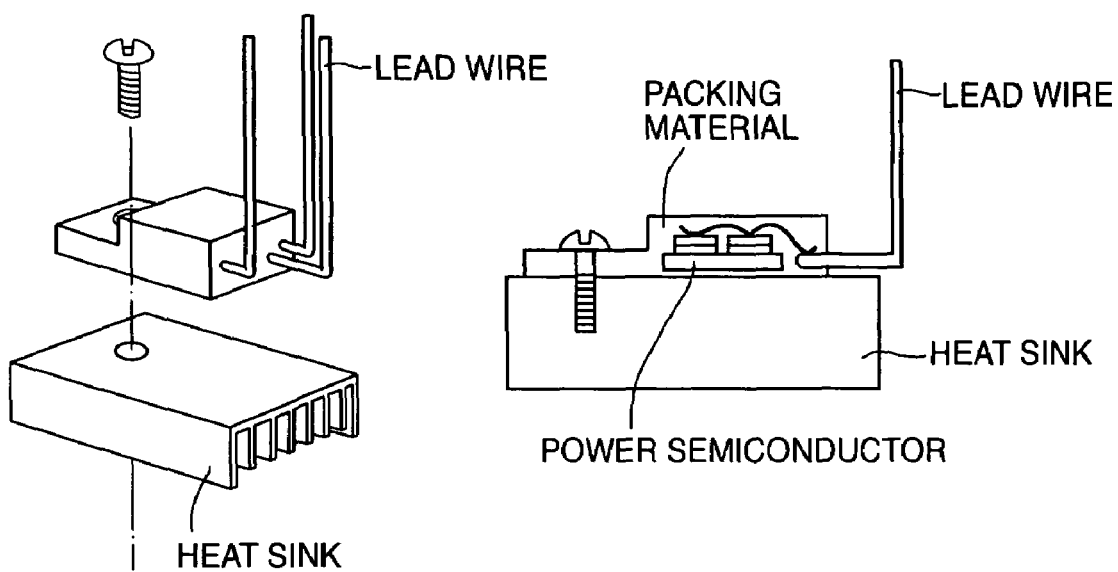
FIG. 32 is a view showing a conventional connected construction between a power semiconductor and a heat sink.

The electric device comprises, as shown in FIG. 31, semiconductor chips 37 fixed to a heat radiating plate 39 by means of solder or the like, and a part of a plurality of lead wires 5 for connection, packed by a resin packing material 36. Therefore, the plurality of lead wires 5 are taken outside from within the resin packing material 36. The semiconductor chips 37 and the plurality of lead wires 5 are electrically connected to each other by metallic wires 38. In addition, the electric device is referred to as a power semiconductor 3 in the following descriptions. A heat radiating surface 40 for surface contact with the heat sink 2 is formed on an opposite surface of the power semiconductor 3 to the heat sink 2. The heat radiating surface 40 is planar. When the power semiconductor 3 is accommodated in the recess 7, an entire area of the heat radiating surface 40 is exposed outside from the opened area of the recess 7. That is, the recess 7 is formed in that manner. The power semiconductor 3 has a structure comprising eight faces and comprises a two-stepped molding consisting of a bottom surface constituting the heat radiating surface 40, a higher top surface constituting a pressed surface 41, a lower top surface and five side surfaces.

The recess 7 is molded so as to have inner sides of the recess 7 fitted onto the pressed surface 41 of the resin packing material 36 positioned in opposition to the radiating surface 40, and other side surfaces of the resin packing material 36 than the pressed surface 41 and the heat radiating surface 40. Openings 6 are formed in the fixture 1 to be close to the recesses 7. The opening 6 serves to permit passage therethrough of the plurality of lead wires 5, which are taken out laterally from one of the side surfaces of the power semiconductor 3 to be bent upward at right angles, in a lump. Therefore, side surfaces (side surfaces along the long sides of the fixture 1 and in directions opposed to the juxtaposed recesses 7) of the recesses 7 are opened so that that side of the power semiconductor 3, from which the plurality of lead wires 5 are taken out, is exposed from the fixture 1. Thereby, the plurality of lead wires 5 are taken out along the long sides of the fixture 1 and in directions opposed to the juxtaposed recesses 7 to be bent at right angles and extended in an opposite direction to the heat sink 2 to electrically connect to a wiring pattern on a printed board (that substrate, on which an electronic equipment driven by the power semiconductor 3 is mounted, and illustration of which is omitted) arranged above the fixture 1.

When the power semiconductors 3 are accommodated in the recesses 7, the fixture 1 is mounted on the mounting surface of the heat sink 2 so that the heat radiating surfaces 40 of the power semiconductors 3 exposed outside from the opened surfaces of the recesses 7 come into surface contact with the mounting surface of the heat sink 2 and the mounting surface of the heat sink 2 is covered by the fixture 1, and when the fixture 1 is fixed to the heat sink 2 by the clamp screws 4, the clamp forces (pressing forces) of the clamp screws 4 are transmitted to the pressed surfaces 41 of the power semiconductors 3 facing the fixture 1. Thereby, the power semiconductors 3 are pressed toward the heat sink 2 by the transmitted clamp forces (pressing forces). This is because the fixture 1 acts to project the power semiconductors 3 outside the fixture 1 from the recesses 7. Owing to this action, the heat radiating surfaces 40 of the power semiconductors 3 are pressed against the surface of the heat sink 2, so that the power semiconductors 3 are pressed against and fixed to the heat sink 2. In this manner, the power semiconductors 3 are pressed against and fixed to the heat sink 2 whereby surface contact between the heat radiating surfaces 40 of the power semiconductors 3 and the heat sink 2 is stabilized and heat resistance therebetween is made stable. Accordingly, the power semiconductors 3 can be enhanced in heat radiating capacity.

According to the 1st embodiment described above, since the recesses 7 are provided to accommodate parts of the power semiconductors 3, at least other side surfaces of the resin packing materials 36 than the heat radiating surfaces 40 can easily come into contact with the fixture 1 and so the positional accuracy of the power semiconductors 3 in the fixture 1 can be enhanced. Also, since elasticity of the whole fixture 1 including the recesses 7 makes it possible to press the power semiconductors 3 against the heat sink 2, a sufficient pressing force can be generated even when the fixture 1 is made thin and lightweight, a decrease in the pressing force, caused by thermal fatigue and creep fatigue, which are generated when left at high temperature over a long term, can be restricted to a minimum, and stabilizing of heat resistance can be achieved. Also, since the pressed surface 41 and other side surfaces of the resin packing material 36 of the power semiconductor 3 can be accommodated in the recess 7, the power semiconductor 3 can be easily positioned while the power semiconductor 3 is pressed against the heat sink 2, so that an improvement in assembling quality can be achieved. Further, since the plurality of lead wires 5 of the power semiconductor 3 can extend through the opening 6 prepared close to the recess 7 on the fixture 1, interference between the lead wires 5 and the fixture 1 can be made minimum when the power semiconductor 3 is inserted into the recess 7, thus enabling an improvement in assembling quality.

In addition, while the embodiment has been described taking an example of a power semiconductor as the electric device, the construction of the embodiment can be applied to various semiconductors, such as electric circuits, electric circuit elements, etc., which perform predetermined functions and predetermined actions, or semiconductor elements.

Also, while the embodiment has been described taking an example, in which the recesses 7 are provided in the fixture 1, the following case will do. More specifically, holding units are provided to project toward the heat sink 2 from a surface of the fixture 1 facing the heat sink 2, and the holding units hold a part or the whole of side surfaces of the power semiconductors 3. Further, the heat radiating surfaces 40 of the power semiconductors 3 are exposed outside from opened areas of the holding units toward the heat sink 2. Also, the pressed surfaces 41 of the power semiconductors 3 are brought into contact with surface of the fixture 1 facing the pressed surfaces 41. With such construction, it is possible to produce the same effect as that in case of providing the recesses 7 on the fixture 1.

Figure 3:
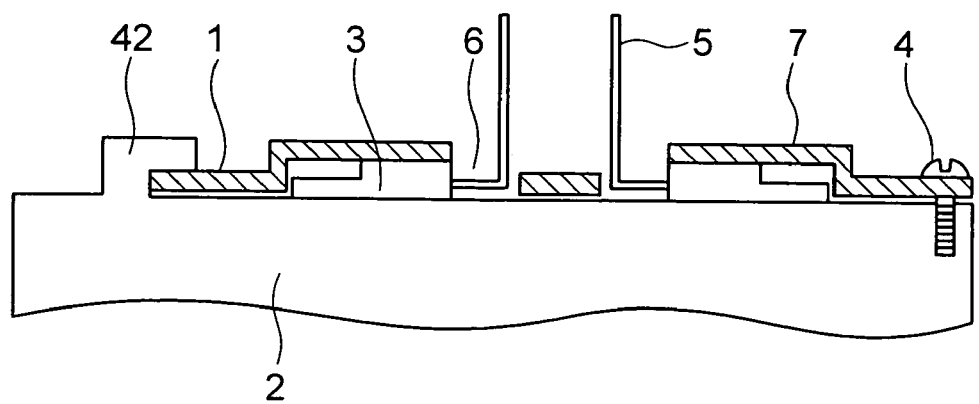
FIG. 3 is a view showing, in cross section, a schematic configuration of a packaged construction of a 2nd embodiment of an electric circuit module of the invention.

FIG. 3 is a view showing, in cross section, a schematic configuration of a packaged construction of a 2nd embodiment of an electric circuit module of the invention. The 2nd embodiment is different from the 1st embodiment in that fitting portions 42 are provided on a heat sink 2 to be fitted onto a fixture 1 and power semiconductors 3 are provided in the fixture 1 between the fitting portions 42 and clamp screws 4.

According to the 2nd embodiment, it is possible to reduce the number of clamp screws 4, by which the fixture 1 is clamped to the heat sink 2, and to reduce the assembly manhour. Also, since the provision of a plurality of fitting portions 42 makes it possible to fix the fixture 1 to the heat sink 2 in a plurality of locations, there is produced an effect that the quality of close contact between heat radiating surfaces 40 of the power semiconductors 3 and the heat sink 2 can be improved and stabilizing of heat resistance can be achieved.

Figure 4:
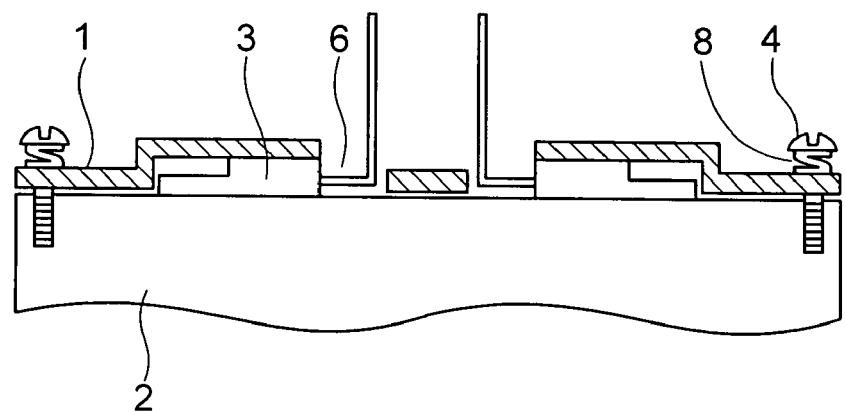
FIG. 4 is a view showing, in cross section, a schematic configuration of a packaged construction of a 3rd embodiment of an electric circuit module of the invention.

FIG. 4 is a view showing, in cross section, a schematic configuration of a packaged construction of a 3rd embodiment of an electric circuit module of the invention. The 3rd embodiment is different from the embodiment described above in that elastic bodies 8 are inserted between heads of clamp screws 4, by which a fixture 1 is clamped to a heat sink 2, and the fixture 1.

According to the 3rd embodiment, since the sheet-shaped, cylindrical-shaped, or spring-shaped elastic bodies 8 inserted below the clamp screws 4 press the fixture 1 toward the heat sink 2 to enable transmitting elastic forces of the elastic bodies 8 to power semiconductors 3 through the fixture 1 to press the power semiconductors 3 against the heat sink 2, that change in pressing forces of the power semiconductors 3 against the heat sink 2, which is caused by deformation of the fixture 1 due to creep fatigue, or the like, can be made minimum, so that there is produced an effect that stabilizing of heat resistance can be achieved.

Figure 5:
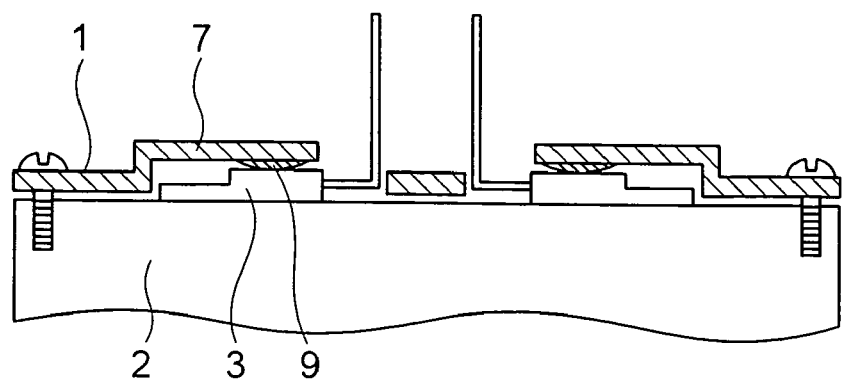
FIG. 5 is a view showing, in cross section, a schematic configuration of a packaged construction of a 4th embodiment of an electric circuit module of the invention.

FIG. 5 is a view showing, in cross section, a schematic configuration of a packaged construction of a 4th embodiment of an electric circuit module of the invention. The 4th embodiment is different from the embodiment described above in that projections 9 are provided on a surface of a fixture 1 facing resin packing materials 36 and the projections 9 are brought into contact with the resin packing materials 36.

According to the 4th embodiment, since recesses 7 for urging power semiconductors 3 against a heat sink 2 can assume a form of a point instead of a surface, unevenness in pressing forces, caused by deformation of the fixture 1 or the like, can be eliminated and substantially uniform pressing forces are given at heat radiating surfaces 40 of the power semiconductors 3, so that there is produced an effect that stabilizing of heat resistance can be achieved.

Figure 6:
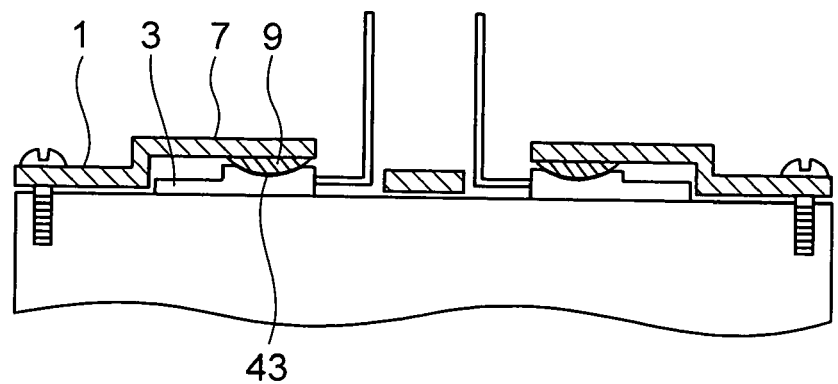
FIG. 6 is a view showing, in cross section, a schematic configuration of a packaged construction of a 5th embodiment of an electric circuit module of the invention.

FIG. 6 is a view showing, in cross section, a schematic configuration of a packaged construction of a 5th embodiment of an electric circuit module of the invention. The 5th embodiment is different from the embodiment described above in that projections 9 are provided on a surface of a fixture 1 facing resin packing materials 36 and depressions 43 are provided on the resin packing materials 36 to accommodate the projections 9 partially therein.

According to the 5th embodiment, since the projections 9 provided on the fixture 1 and the depressions 43 provided on the resin packing materials 36 are brought into contact with each other, thereby enabling controlling a contact area, decreasing crush and deformation of the projections 9, and eliminating unevenness in pressing forces, and substantially uniform pressing forces are given at the heat radiating surfaces 40 of the plurality of power semiconductors 3, there is produced an effect that stabilizing of heat resistance can be achieved. Also, when the projections 9 and the depressions 43 are molded with a conforming spherical surface, the positional accuracy of the power semiconductors 3 is enhanced to be effective for an improvement in assembling quality.

Figure 7:
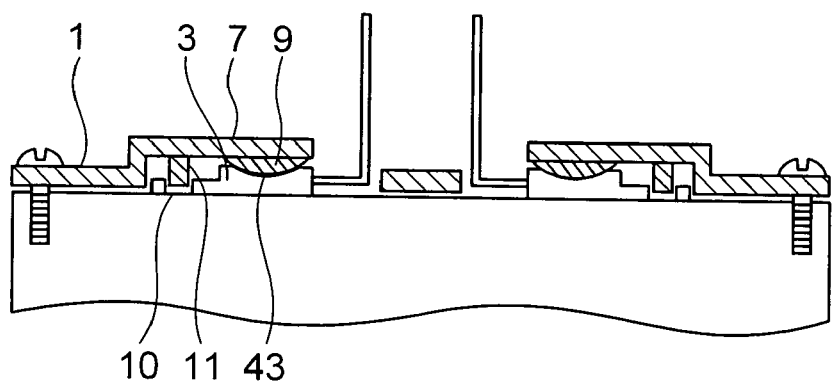
FIG. 7 is a view showing, in cross section, a schematic configuration of a packaged construction of a 6th embodiment of an electric circuit module of the invention.

FIG. 7 is a view showing, in cross section, a schematic configuration of a packaged construction of a 6th embodiment of an electric circuit module of the invention. The 6th embodiment is different from the embodiment described above in that projections 9 and positioning projections 11 are provided on a surface of a fixture 1 facing resin packing materials 36, the projections 9 are in contact with depressions 43 provided on the resin packing materials 36, and the positioning projections 11 are aligned with holes 10 provided on the resin packing materials.

According to the 6th embodiment, that accuracy, with which power semiconductors 3 are positioned in recesses 7 of the fixture 1, can be enhanced by the projections 9, the positioning projections 11, the depressions 43, with which the projections 9 are in contact, and the holes 10, with which the positioning projections 11 are aligned, it is effective for an improvement in assembling quality.

Figure 8:
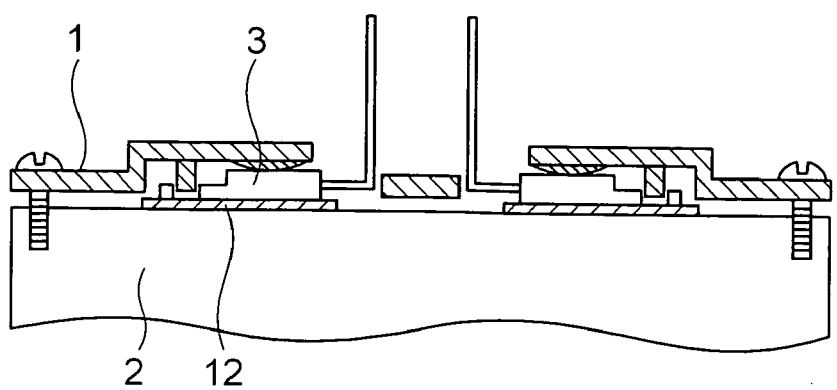
FIG. 8 is a view showing, in cross section, a schematic configuration of a packaged construction of a 7th embodiment of an electric circuit module of the invention.

FIG. 8 is a view showing, in cross section, a schematic configuration of a packaged construction of a 7th embodiment of an electric circuit module of the invention. The 7th embodiment is different from the embodiment described above in that sheets 12 having a lower elasticity than those of resin packing materials 36 and a fixture 1 and a thermal conductivity are provided between a heat sink 2 and heat radiating surfaces 40.

According to the 7th embodiment, since the sheet 12 of low elasticity can accommodate irregularities of the heat radiating surfaces 40 of the power semiconductors 3 and the heat sink 2, there is produced an effect that it is possible to achieve averaging of heat resistance. Further, since the elastic force of the pressed sheet can accommodate changes in heat resistance, caused by changes and ununiformity in pressing force, which are caused by thermal fatigue and creep fatigue of the fixture 1, there is produced an effect that it is possible to achieve stabilizing of heat resistance over a long term.

Figure 9:
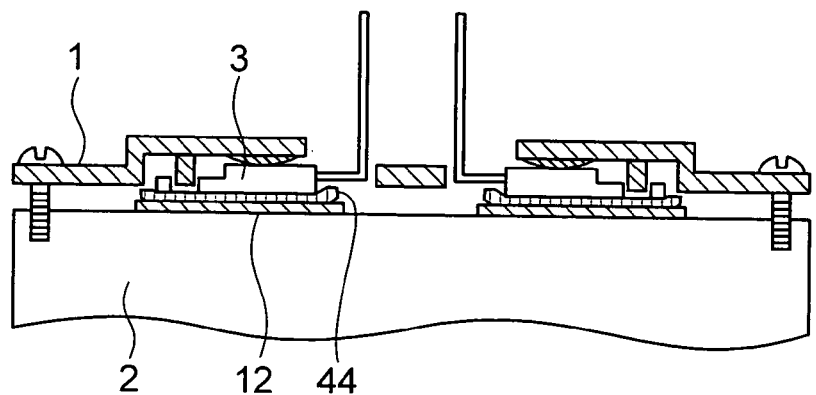
FIG. 9 is a view showing, in cross section, a schematic configuration of a packaged construction of an 8th embodiment of an electric circuit module of the invention.

FIG. 9 is a view showing, in cross section, a schematic configuration of a packaged construction of an 8th embodiment of an electric circuit module of the invention. The 8th embodiment is different from the embodiment described above in that a sheet 12 is composed of an insulating thermal conductive body, in which an insulating resin and thermal conductive powder are mixed together, and a silicone rubber layer 44 having an stick property is provided on a surface of the insulating thermal conductive body sheet 12 facing a heat radiating surfaces 40.

According to the 8th embodiment, since heat resistance is decreased while enabling insulation between the heat radiating surfaces 40 of power semiconductors 3 and a heat sink 2, and the silicone rubber layer 44 having a high stickiness and an excellent insulating property is provided on the heat radiating surfaces 40, there is produced an effect that it is possible to prevent coming-off of the insulating thermal conductive body sheet 12, to decrease an air layer generated between the insulating thermal conductive body sheet 12 and the heat radiating surfaces, and to suppress deterioration in insulation life, caused by partial discharge. Further, when the silicone rubber layer 44 is composed of silicone gel, which is obtained by curing a silicone oil in a gel state, the silicone oil having an excellent permeability wets and spreads evenly on the sheet 12 and the heat radiating surfaces 40 to form a coating film of silicone gel and silicone oil, thus enabling forming a further insulating layer to produce an effect that it is possible to suppress deterioration in insulation life, caused by partial discharge.

Figure 10:
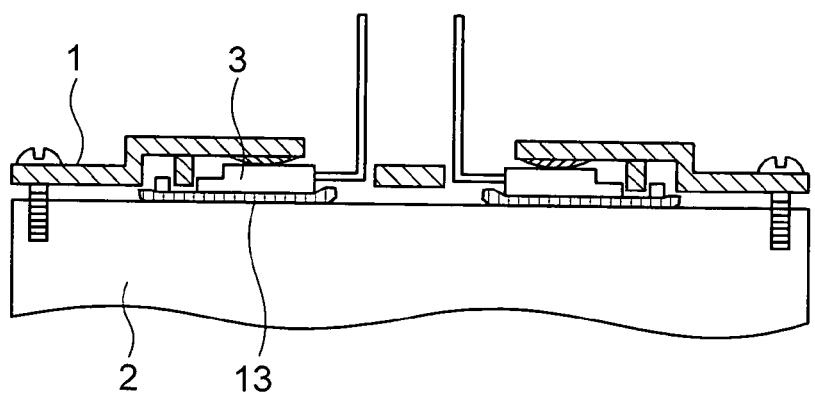
FIG. 10 is a view showing, in cross section, a schematic configuration of a packaged construction of a 9th embodiment of an electric circuit module of the invention.

FIG. 10 is a view showing, in cross section, a schematic configuration of a packaged construction of a 9th embodiment of an electric circuit module of the invention. The 9th embodiment is different from the embodiment described above in that a thermal conductive adhesive layer 13, in which an insulating resin and thermal conductive powder are mixed together, is provided between a heat sink 2 and heat radiating surfaces 40, and the adhesive layer 13 has a lower elasticity than those of the resin packing materials 36 and a fixture 1. In addition, the adhesive layer 13 is beforehand coated on the heat sink 2, pressingly extended by the heat radiating surfaces 40 when the fixture 1 and the power semiconductors 3 are mounted on the heat sink 2, and thereafter cured to bond the power semiconductors 3 and the heat sink 2 together.

According to the 9th embodiment, since it is possible to provide the adhesive layer 13, which connects the heat sink 2 and the heat radiating surfaces 40 together and has a low elasticity and a high thermal conductivity, there is produced an effect that the adhesive layer 13 of low elasticity can accommodate irregularities of the heat radiating surfaces 40 of the power semiconductors 3 and the heat sink 2 and decreasing and averaging of heat resistance can be achieved. Further, since the elastic force of the pressed adhesive layer being a resin of low elasticity can accommodate changes in heat resistance, caused by changes and ununiformity in pressing force, which are caused by thermal fatigue and creep fatigue of the fixture 1, there is produced an effect that it is possible to achieve stabilizing of heat resistance.

Figure 11:
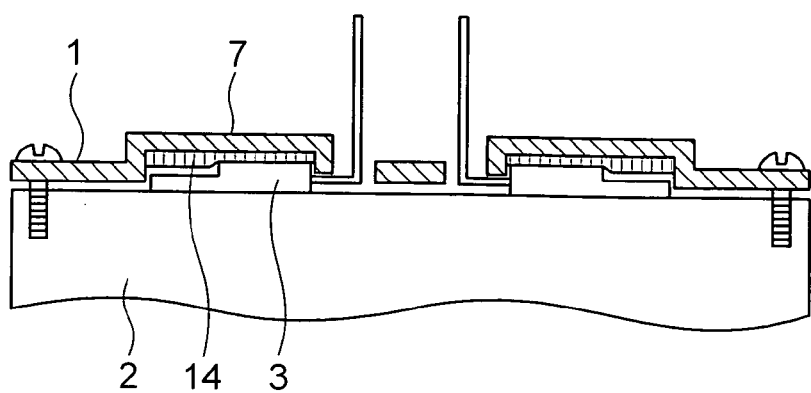
FIG. 11 is a view showing, in cross section, a schematic configuration of a packaged construction of a 10th embodiment of an electric circuit module of the invention.

FIG. 11 is a view showing, in cross section, a schematic configuration of a packaged construction of a 10th embodiment of an electric circuit module of the invention. The 10th embodiment is different from the embodiment described above in that a resin layer 14 is provided in recesses 7, which face the pressed surfaces 41, to have a lower elasticity than those of a fixture 1 and the resin packing materials 36, and the resin layer 14 and the resin packing materials 36 are in contact with each other. In addition, the resin layer 14 may be formed by pouring a liquid resin into the recesses 7 to cure the same, or may be composed of sheets, which are beforehand cut into a shape receivable in the recesses 7.

According to the 10th embodiment, since a pressing force of the fixture 1 is transmitted to surfaces of the resin packing materials 36 through the resin layer 14 of low elasticity and the resin layer 14 can accommodate irregularities of the pressed surfaces 41 and the recesses 7, there is produced an effect that it is possible to minimize unevenness in pressing forces exerted on a heat sink 2 by power semiconductors 3 and to achieve stabilizing of heat resistance. Further, since the resin 14 of low elasticity can minimize that unevenness in pressing forces exerted on the heat sink 2 by the power semiconductors 3, which is caused by deformation of the fixture 1 due to creep fatigue or the like, there is produced an effect that it is possible to achieve stabilizing of heat resistance.

Figure 12:
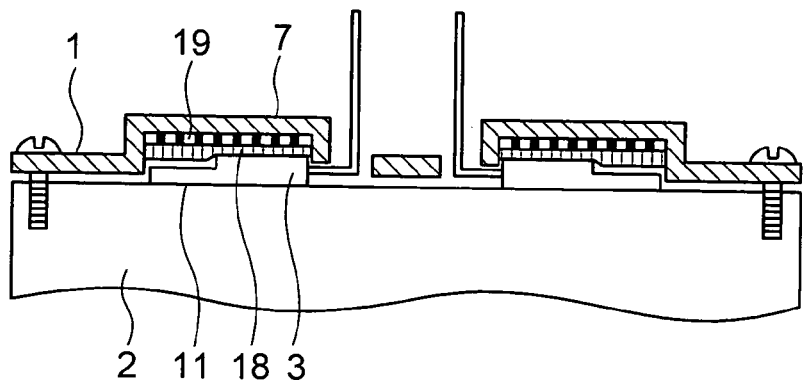
FIG. 12 is a view showing, in cross section, a schematic configuration of a packaged construction of an 11th embodiment of an electric circuit module of the invention.

FIG. 12 is a view showing, in cross section, a schematic configuration of a packaged construction of an 11th embodiment of an electric circuit module of the invention. The 11th embodiment is different from the embodiment described above in that provided in recesses 7 facing pressed surfaces 41, is a resin sheet 18, which is beforehand cut into a shape receivable in the recesses 7 and has a lower elasticity than those of a fixture 1, of which surface facing the recesses 7 is beforehand coated thin with an adhesive 19, and resin packing materials 36, and that the resin sheet 18 and the resin packing materials 36 are in contact with each other.

According to the 11th embodiment, since a pressing force of the fixture 1 is transmitted to surfaces of the resin packing materials 36 through the resin sheet 18 of low elasticity and the resin sheet 18 can accommodate irregularities of the pressed surfaces 41 and the recesses 7, there is produced an effect that it is possible to minimize unevenness in pressing forces exerted on a heat sink 2 by power semiconductors 3 and to achieve stabilizing of heat resistance. Further, since the resin sheet 18 of low elasticity can minimize that unevenness in pressing forces exerted on the heat sink 2 by the power semiconductors 3, which is caused by deformation of the fixture 1 due to creep fatigue or the like, there is produced an effect that it is possible to achieve stabilizing of heat resistance. Also, since the resin sheet 18 can be inserted into the fixture to be bonded thereto to prevent coming-off of the resin sheet 18, an improvement in assembling quality can be achieved.

Figure 13:
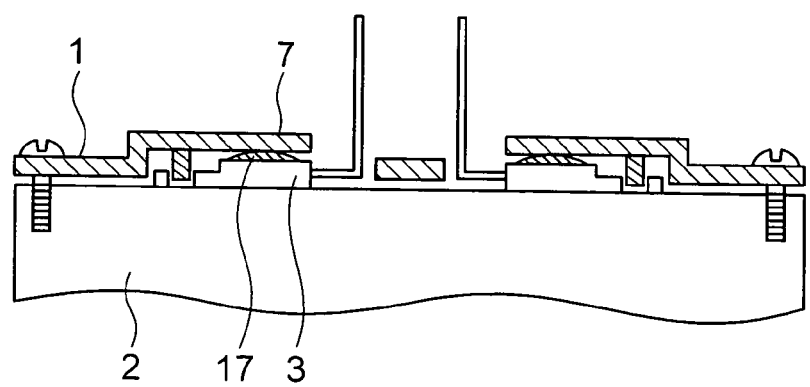
FIG. 13 is a view showing, in cross section, a schematic configuration of a packaged construction of a 12th embodiment of an electric circuit module of the invention.

FIG. 13 is a view showing, in cross section, a schematic configuration of a packaged construction of a 12th embodiment of an electric circuit module of the invention. The 12th embodiment is different from the embodiment described above in that a resin 17 having a lower elasticity than those of a fixture 1 and resin packing materials 36 is formed on pressed surfaces 41 of the resin packing materials 36, and the resin 17 is in contact with the fixture 1.

According to the 12th embodiment, since a pressing force of the fixture 1 can be transmitted relatively evenly to surfaces of the resin packing materials 36 through the resin 17 without being influenced by irregularities of the fixture 1 and the resin packing materials 36, there is produced an effect that it is possible to achieve stabilizing of heat resistance. Further, since the resin 17 of low elasticity can minimize that unevenness in pressing forces exerted on the heat sink 2 by the power semiconductors 3, which is caused by deformation of the fixture 1 due to creep fatigue or the like, there is produced an effect that it is possible to achieve stabilizing of heat resistance.

Figure 14:
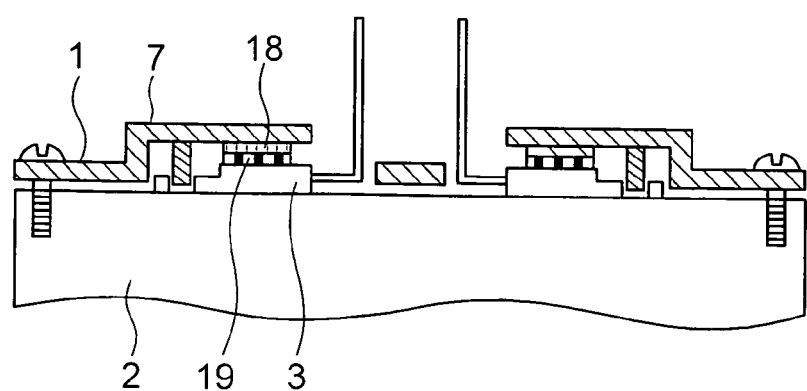
FIG. 14 is a view showing, in cross section, a schematic configuration of a packaged construction of a 13th embodiment of an electric circuit module of the invention.

FIG. 14 is a view showing, in cross section, a schematic configuration of a packaged construction of a 13th embodiment of an electric circuit module of the invention. The 13th embodiment is different from the embodiment described above in that a resin sheet 18, which has a lower elasticity than those of a fixture 1 and resin packing materials 36 and includes an adhesive 19 on one surface thereof, is bonded to pressed surfaces 41 by the adhesive 19, and that the resin sheet 18 and the fixture 1 are in contact with each other.

According to the 13th embodiment, since a pressing force of the fixture 1 can be transmitted relatively evenly to surfaces of the resin packing materials 36 through the resin sheet 18 without being influenced by irregularities of the fixture 1 and the resin packing materials 36, there is produced an effect that it is possible to achieve stabilizing of heat resistance. Further, since the resin sheet 18 of low elasticity can minimize that unevenness in pressing forces exerted on the heat sink 2 by the power semiconductors 3, which is caused by deformation of the fixture 1 due to creep fatigue or the like, there is produced an effect that it is possible to achieve stabilizing of heat resistance. Also, since the resin sheet 18 can be bonded to the power semiconductors 3 in advance, it is possible to prevent coming-off of the resin sheet 18 and to achieve an improvement in assembling quality.

Figure 15:
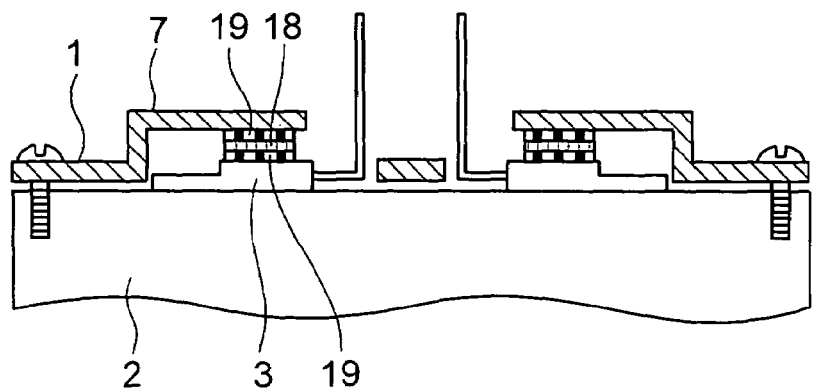
FIG. 15 is a view showing, in cross section, a schematic configuration of a packaged construction of a 14th embodiment of an electric circuit module of the invention.

FIG. 15 is a view showing, in cross section, a schematic configuration of a packaged construction of a 14th embodiment of an electric circuit module of the invention. The 14th embodiment is different from the embodiment described above in that a resin sheet 18, which has a lower elasticity than those of a fixture 1 and resin packing materials 36 and includes an adhesive 19 on both surfaces thereof, is bonded to pressed surfaces 41, and that the resin sheet 18 and recesses 7 of the fixture 1 are bonded together by the adhesive 19.

According to the 14th embodiment, since the resin sheet 18 having the double-sided bonding function can eliminate coming-off of the resin sheet 18 and coming-off of power semiconductors 3 from within a fixture, an improvement in assembling quality can be achieved. Further, since a pressing force of the fixture 1 can be transmitted relatively evenly to surfaces of the resin packing materials 36 through the resin sheet 18 without being influenced by irregularities of the fixture 1 and the resin packing materials 36, there is produced an effect that it is possible to achieve stabilizing of heat resistance. Further, since the resin sheet 18 of low elasticity can minimize that unevenness in pressing forces exerted on the heat sink 2 by the power semiconductors 3, which is caused by deformation of the fixture 1 due to creep fatigue or the like, there is produced an effect that it is possible to achieve stabilizing of heat resistance.

Figure 16:
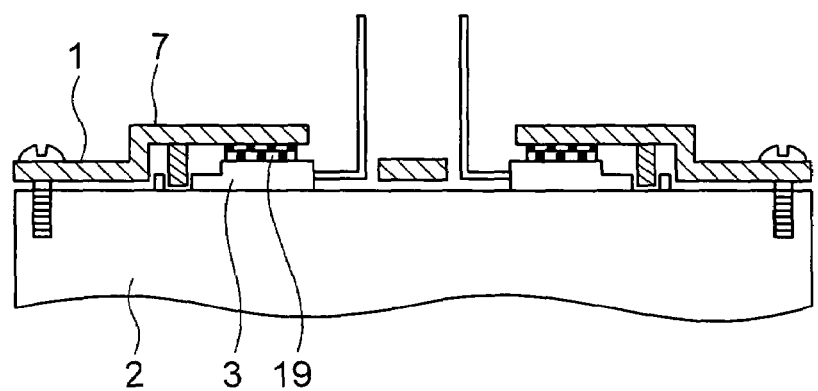
FIG. 16 is a view showing, in cross section, a schematic configuration of a packaged construction of a 15th embodiment of an electric circuit module of the invention.

FIG. 16 is a view showing, in cross section, a schematic configuration of a packaged construction of a 15th embodiment of an electric circuit module of the invention. The 15th embodiment is different from the embodiment described above in that an adhesive 19 for bonding of power semiconductors 3 is provided on that surface of a fixture 1, which comes into contact with resin packing materials 36.

According to the 15th embodiment, since the adhesive 19 is beforehand coated in recesses 7 of the fixture 1 to enable the power semiconductors 3 to be fixed to the fixture 1 simultaneously when the power semiconductors are inserted into the recesses 7 and thus coming-off of the power semiconductors 3 from within the fixture can be eliminated, an improvement in assembling quality can be achieved.

Figure 17:
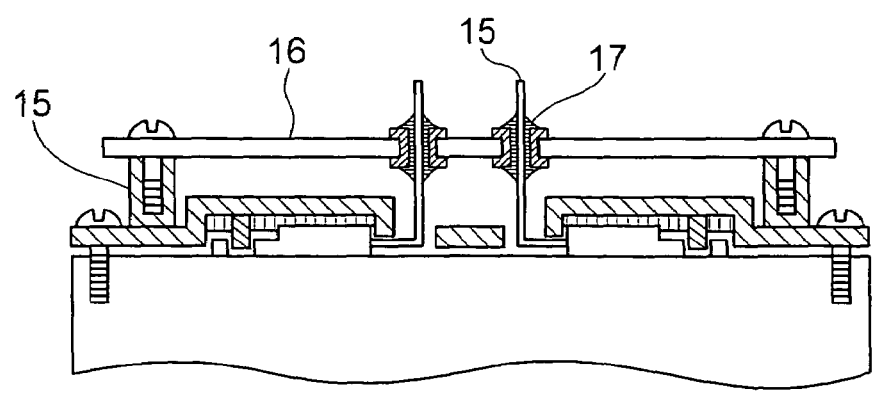
FIG. 17 is a view showing, in cross section, a schematic configuration of a packaged construction of a 16th embodiment of an electric circuit module of the invention.

FIG. 17 is a view showing, in cross section, a schematic configuration of a packaged construction of a 16th embodiment of an electric circuit module of the invention. The 16th embodiment is different from the embodiment described above in that a fixture 1 comprises stays 15 for fixation of a printed circuit board 16, to which lead wires 5 are to be connected.

According to the 16th embodiment, since the positional alignment between the lead wires 5 and through-holes 17 of the printed circuit board 16 for soldering connection can be improved, an improvement in assembling quality can be achieved.

Figure 18:
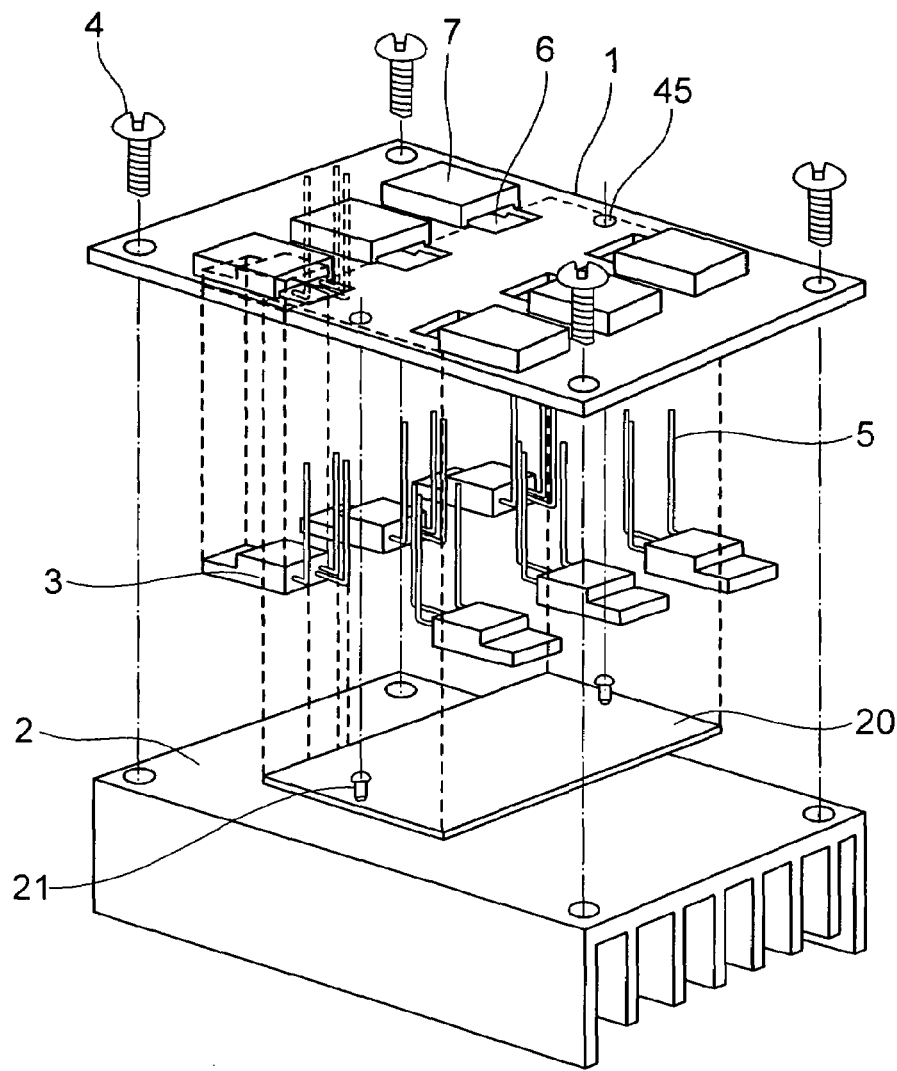
FIG. 18 is a view showing a schematic configuration of a packaged construction of a 17th embodiment of an electric circuit module of the invention.

FIG. 18 is a view showing a schematic configuration of a packaged construction of a 17th embodiment of an electric circuit module of the invention. The 17th embodiment is different from the embodiment described above in that a coming-off preventive member 20 for prevention of coming-off of power semiconductors 3 from a fixture 1 is provided, the coming-off preventive member 20 includes concave-convex portions 21 for fixation thereof to the fixture 1, and the fixture includes concave-convex portions 45 to mesh with the concave-convex portions 21.

According to the 17th embodiment, since the coming-off preventive member 20 constrains the power semiconductors 3 partially to be able to eliminate coming-off of the power semiconductors 3 from within the fixture 1, an improvement in assembling quality can be achieved.

Figure 19:
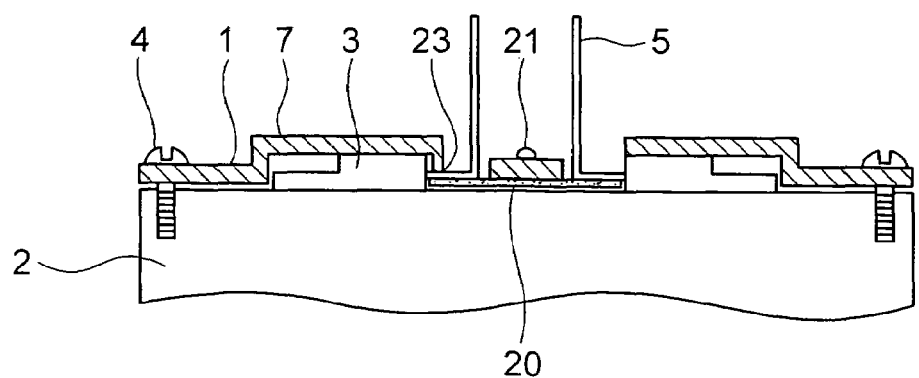
FIG. 19 is a view showing, in cross section, a schematic configuration of a packaged construction of an 18th embodiment of an electric circuit module of the invention.

FIG. 19 is a view showing, in cross section, a schematic configuration of a packaged construction of an 18th embodiment of an electric circuit module of the invention. The 18th embodiment is different from the embodiment described above in that a coming-off preventive member 20 is arranged on a side of a fixture 1 toward a heat sink in such a manner that lead wires are partially interposed between the coming-off preventive member 20 and lead fixing projections 23 provided on the fixture 1.

According to the 18th embodiment, since lead wires 5 of power semiconductor 3 are constrained from a side of the heat sink 2 by the coming-off preventive member 20 and the lead fixing projections 23 and thus coming-off of the power semiconductors 3 from within the fixture 1 can be eliminated, an improvement in assembling quality can be achieved.

Figure 20:
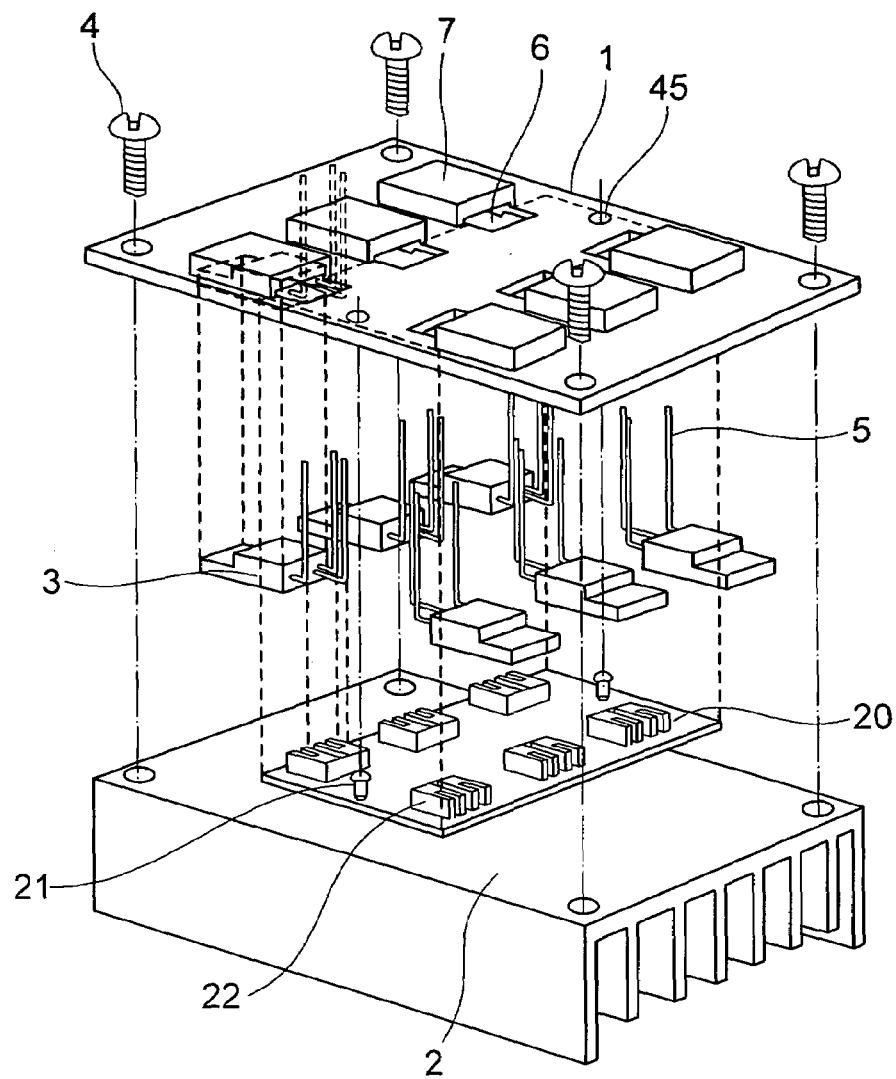
FIG. 20 is a view showing a schematic configuration of a packaged construction of a 19th embodiment of an electric circuit module of the invention.
Figure 21:
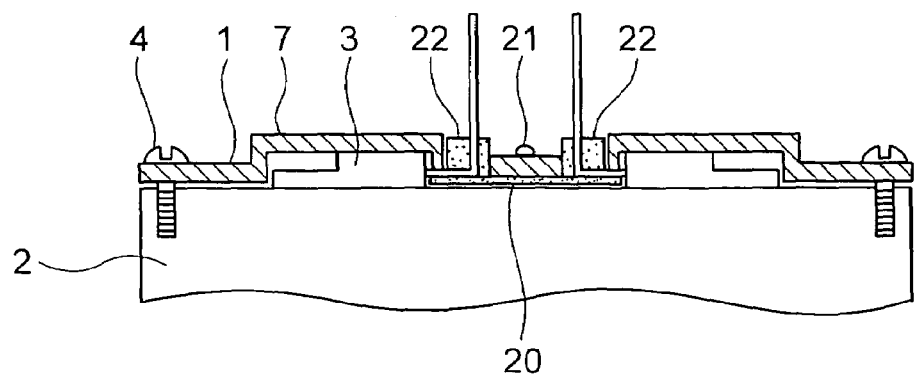
FIG. 21 is a cross sectional view showing the configuration of FIG. 20.

FIG. 20 is a view showing a schematic configuration of a packaged construction of a 19th embodiment of an electric circuit module of the invention, and FIG. 21 is a view showing the configuration of FIG. 20 in cross section. The 19th embodiment is different from the embodiment described above in that a coming-off preventive member 20 is arranged on a side of a fixture 1 toward a heat sink 2, lead wires 5 are partially interposed between the coming-off preventive member 20 and the fixture 1, the coming-off preventive member 20 includes slit-shaped wiring accommodating portions 22, and the wiring accommodating portions 22 have the function of accommodating a part of the lead wires 5 and positioning the lead wires 5.

According to the 19th embodiment, since it is possible to accommodate a part of the lead wires 5 in the coming-off preventive member 20 and to position the lead wires 5 on the basis of the fixture 1 with high accuracy, an improvement in the quality of assembling with a printed circuit board 16 (not shown) can be achieved.

Figure 22:
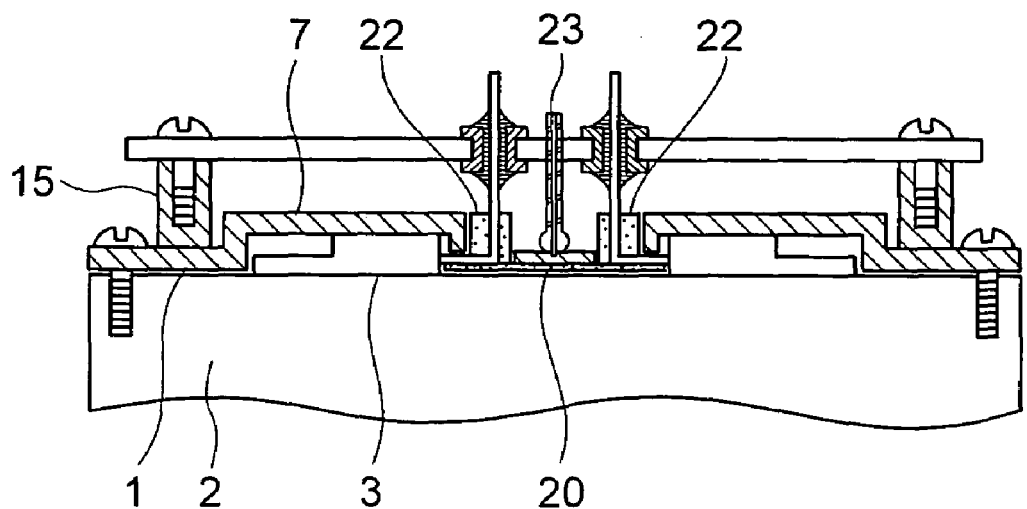
FIG. 22 is a view showing, in cross section, a schematic configuration of a packaged construction of a 20th embodiment of an electric circuit module of the invention.

FIG. 22 is a view showing, in cross section, a schematic configuration of a packaged construction of a 20th embodiment of an electric circuit module of the invention. The 20th embodiment is different from the embodiment described above in that rod-shaped projections 23, which extend through a fixture 1 and a printed circuit board 16, are provided on a coming-off preventive member 20.

According to the 20th embodiment, since the positional relationship among lead wires 5, the fixture 1 and the printed circuit board 16 can be determined on the basis of the coming-off preventive member 20 with high accuracy, an improvement in assembling quality can be achieved.

Figure 23:
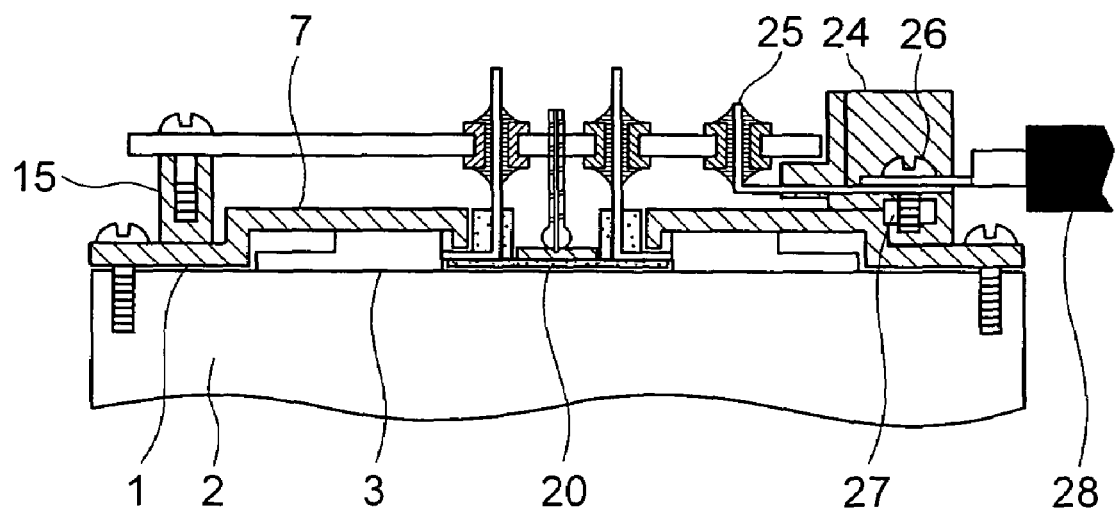
FIG. 23 is a view showing, in cross section, a schematic configuration of a packaged construction of a 21st embodiment of an electric circuit module of the invention.

FIG. 23 is a view showing, in cross section, a schematic configuration of a packaged construction of a 21st embodiment of an electric circuit module of the invention. The 21st embodiment is different from the embodiment described above in that a fixture 1 is made of a resin having an insulating property, and the fixture 1 comprises a terminal base 24 for fixation of external wirings 28, through which an electric signal and electric power are input from and output to an external circuit, and has the function of clamping wirings 25 and the external wirings 28, which are accommodated in the terminal base 24, by means of screws 26 and nuts 27 to electrically connect the same together.

According to the 21st embodiment, since the terminal base 24 is provided on the fixture 1 to enable inputting and outputting a signal and electric power and so a printed circuit board 16 can be made small in size, it is possible to provide a small-sized electric circuit module.

Figure 24:
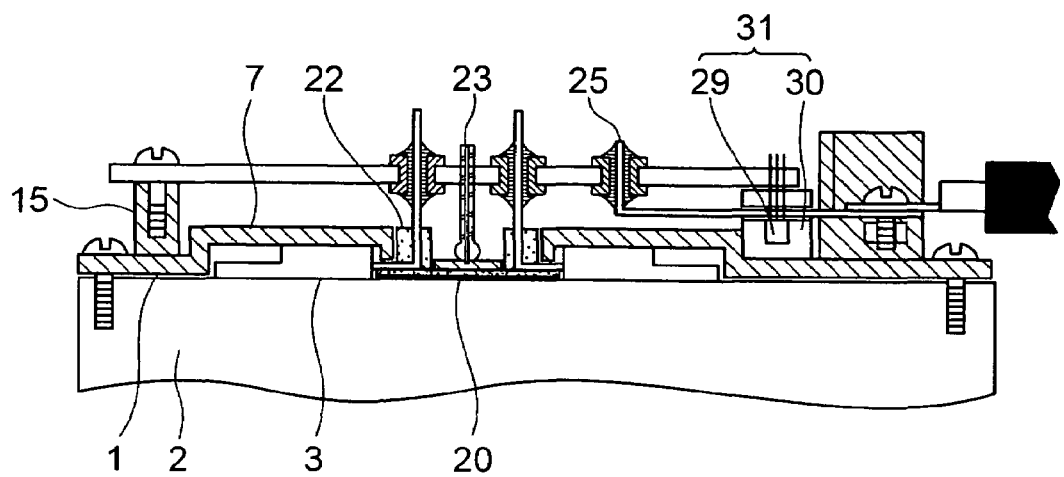
FIG. 24 is a view showing, in cross section, a schematic configuration of a packaged construction of a 22nd embodiment of an electric circuit module of the invention.

FIG. 24 is a view showing, in cross section, a schematic configuration of a packaged construction of a 22nd embodiment of an electric circuit module of the invention. The 22nd embodiment is different from the embodiment described above in that a fixture 1 is made of a resin having an insulating property, a wiring member 25, which serves for detection of electric current, and through which an electric signal and electric power inside or outside the electric circuit module are input and output, is built in the fixture 1, the wiring member 25 for detection of electric current extends through an annular magnetic body 30 having an opening, a magnetic sensor 29 is mounted to the opening of the annular magnetic body 30, and the function of a current sensor 31 to collect magnetic flux created by electric current, which flows through the wiring member 25 for detection of electric current, by means of the annular magnetic body 30 and to detect the collected magnetic flux by means of the magnetic sensor 29 is structured in a part of the fixture 1.

According to the 22nd embodiment, the current sensor 31 can be provided on the fixture 1 to eliminate the need for a printed circuit board 16 for the current sensor 31 and the wiring member 25, so that the printed circuit board 16 can be made small in mount area to contribute to miniaturization of the electric circuit module.

Figure 25:
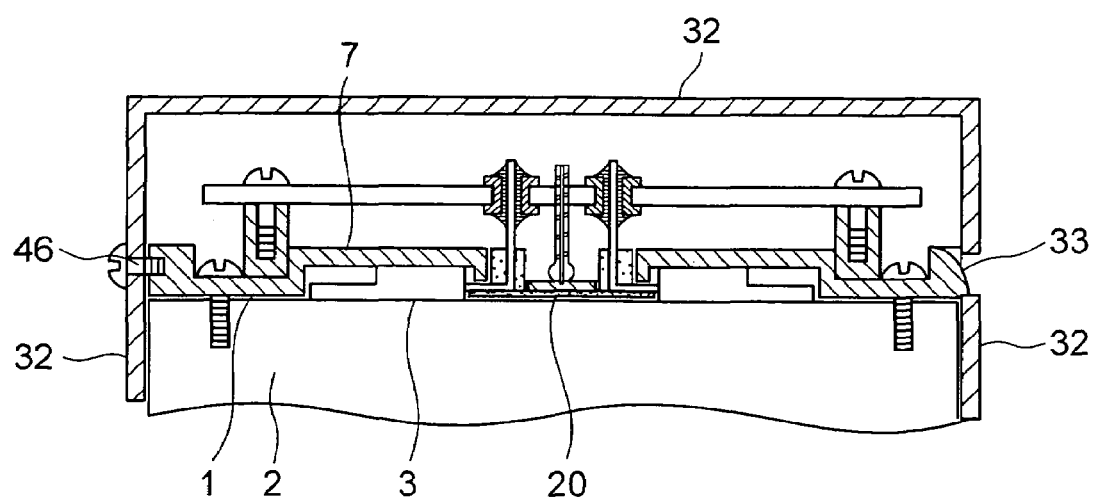
FIG. 25 is a view showing, in cross section, a schematic configuration of a packaged construction of a 23rd embodiment of an electric circuit module of the invention.

FIG. 25 is a view showing, in cross section, a schematic configuration of a packaged construction of a 23rd embodiment of an electric circuit module of the invention. The 23rd embodiment is different from the embodiment described above in that a fixture 1 includes a case fitting portion 33 or a screw fitting portion 46, which serves for fixation of a resin or metal case 32 to accommodate therein an electrical equipment constituted with the use of the electric circuit module.

The 23rd embodiment eliminates the need of providing a fitting portion for fixation of the case 32 on a heat sink 2, so that it can contribute to miniaturization and low cost of the heat sink 2.

Figure 26:
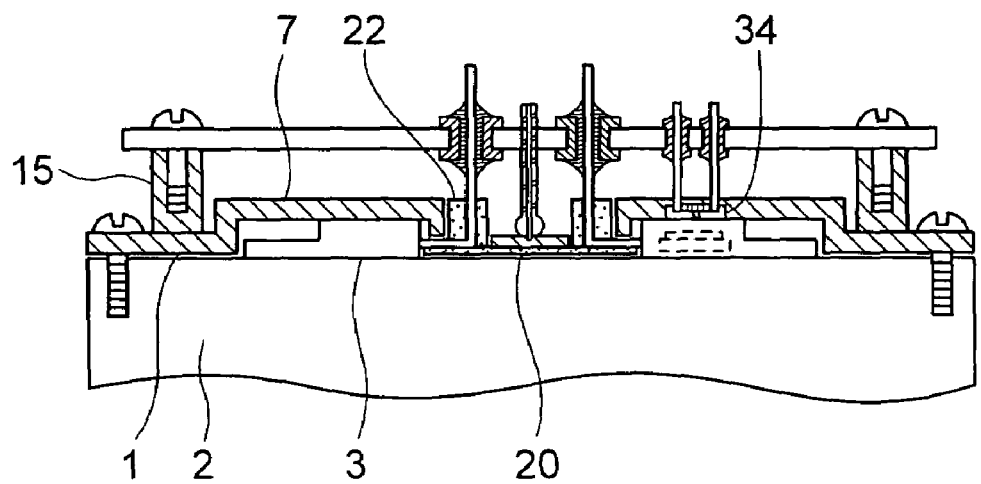
FIG. 26 is a view showing, in cross section, a schematic configuration of a packaged construction of a 24th embodiment of an electric circuit module of the invention.

FIG. 26 is a view showing, in cross section, a schematic configuration of a packaged construction of a 24th embodiment of an electric circuit module of the invention. The 24th embodiment is different from the embodiment described above in that a temperature sensor 34 is built in a recess 7 of a fixture 1 opposed to the pressed surface 41 and a wiring for the temperature sensor 34 is taken out from the fixture 1.

According to the 24th embodiment, since the temperature sensor for measurement of temperature of a power semiconductor 3 can be arranged in the vicinity of the power semiconductor 3, it is possible to contribute to making the electric circuit module highly reliable.

Figure 27:
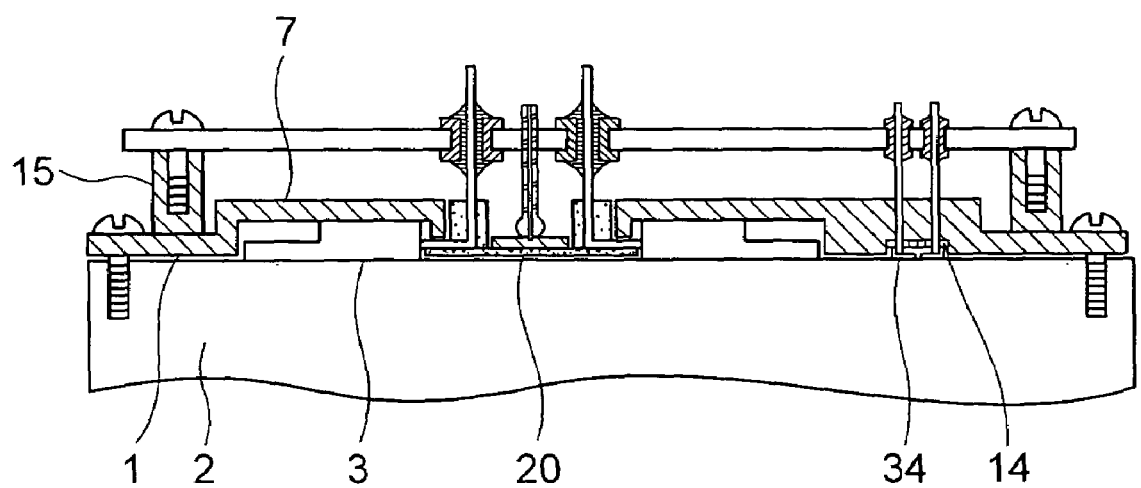
FIG. 27 is a view showing, in cross section, a schematic configuration of a packaged construction of a 25th embodiment of an electric circuit module of the invention.

FIG. 27 is a view showing, in cross section, a schematic configuration of a packaged construction of a 25th embodiment of an electric circuit module of the invention. The 25th embodiment is different from the embodiment described above in that a temperature sensor 34 for detection of temperatures of a heat sink 2 is arranged at a portion of a fixture 1 facing the heat sink 2 and in the vicinity of heat radiating surfaces 40 of power semiconductors 3 and a resin or a resin sheet 14 of low elasticity is interposed between the fixture 1 and the temperature sensor 34 to press and fix the temperature sensor 34 to the heat sink 2.

According to the 25th embodiment, the fixture 1 presses the temperature sensor 34 to the heat sink 2 to enable directly measuring a surface temperature of the heat sink 2, thus contributing to making the electric circuit module highly reliable.

Figure 28:
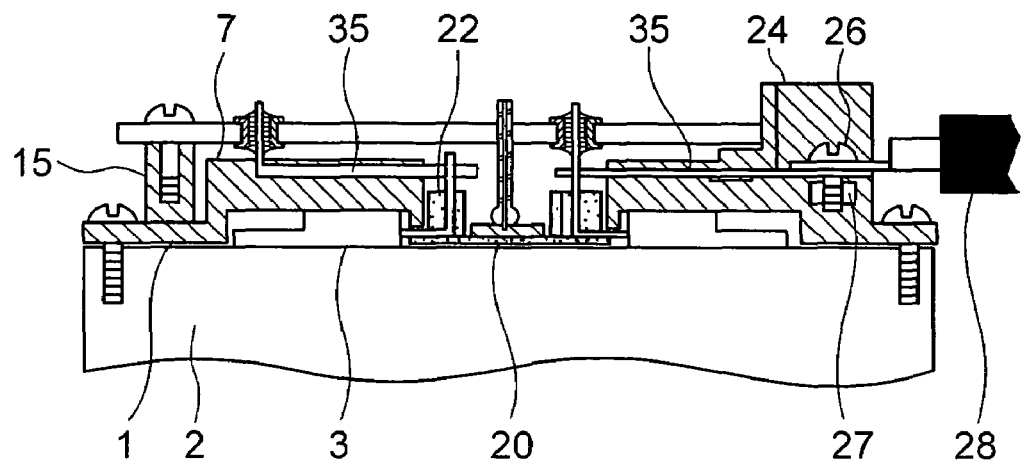
FIG. 28 is a view showing, in cross section, a schematic configuration of a packaged construction of a 26th embodiment of an electric circuit module of the invention.

FIG. 28 is a view showing, in cross section, a schematic configuration of a packaged construction of a 26th embodiment of an electric circuit module of the invention. The 26th embodiment is different from the embodiment described above in that intermediate connection wirings 35 connected electrically to a plurality of lead wirings 5 of power semiconductors 3 are built in a fixture 1 and the intermediate connection wirings 35 can be connected to the printed circuit board 16 or the external circuit wirings 28.

According to the 26th embodiment, when the lead wirings 5 of the power semiconductors 3 are not conformed in shape to the printed circuit board 16, or there is a shortage of current capacity, the intermediate connection wirings 35 are used to enable connection, which can contribute to miniaturization of the printed circuit board 16 and miniaturization of the electric circuit module.

Figure 29:
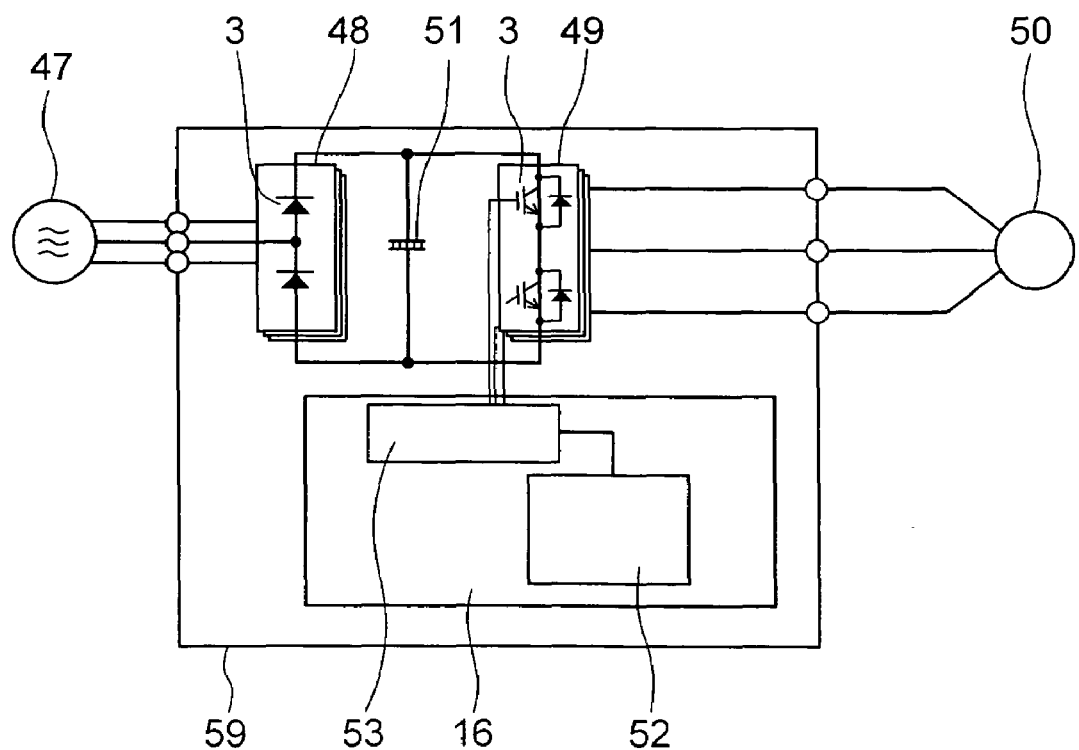
FIG. 29 is a view showing a construction of a power conversion equipment making use of the electric circuit module according to the embodiment.

FIG. 29 shows a construction of a power conversion equipment 59, to which any one of the 1st to 26th embodiments of the electric circuit module described above is applied. The power conversion equipment 59 constitutes a motor drive system, in which AC electric power supplied from a commercial power supply 47 is smoothed into DC electric power by a converter unit 48 of the power conversion equipment 59, the DC electric power is converted into AC electric power of a predetermined voltage and a predetermined frequency by an inverter unit 49 of the power conversion equipment 59, and the electric power is supplied to an electric load, for example, an electric motor 50. The power conversion equipment 59 comprises the converter unit 48 (power rectifying unit) composed of a rectifying device such as diode or the like, the inverter unit 49 (power inverting unit) of PWM (pulse wide modulation) control system, and a smoothing capacitor 51 (capacitor) connected to a direct current portion between the converter unit 48 and the inverter unit 49, and is accommodated in a case of the power conversion equipment. The converter unit 48 and the inverter unit 49 are composed of any one of the 1st to 26th embodiments of the electric circuit module described above. For the inverter unit 49, a PWM control signal created by a computer 52 is input into a drive circuit 53 and the drive circuit 53 ON/OFF controls the power semiconductors 3, which constitute the inverter unit 49, according to the PWM control signal.

According to this power conversion equipment, since any one of the 1st to 26th embodiments of the electric circuit module of the invention, which is high in reliability, small in size, and low in cost, is used to constitute the converter unit 48 and the inverter unit 49, it is possible to achieve making the power conversion equipment 59, for example, a motor drive system small in size, low in cost, and high in reliability. In addition, while AC electric power supplied from the commercial power supply 47 is smoothed into DC electric power by the converter unit 48 of the power conversion equipment 59 in this example, application to a photovoltaic power generation system, in which solar cells are used as DC electric power supply, and the like is also enabled.

Figure 30:
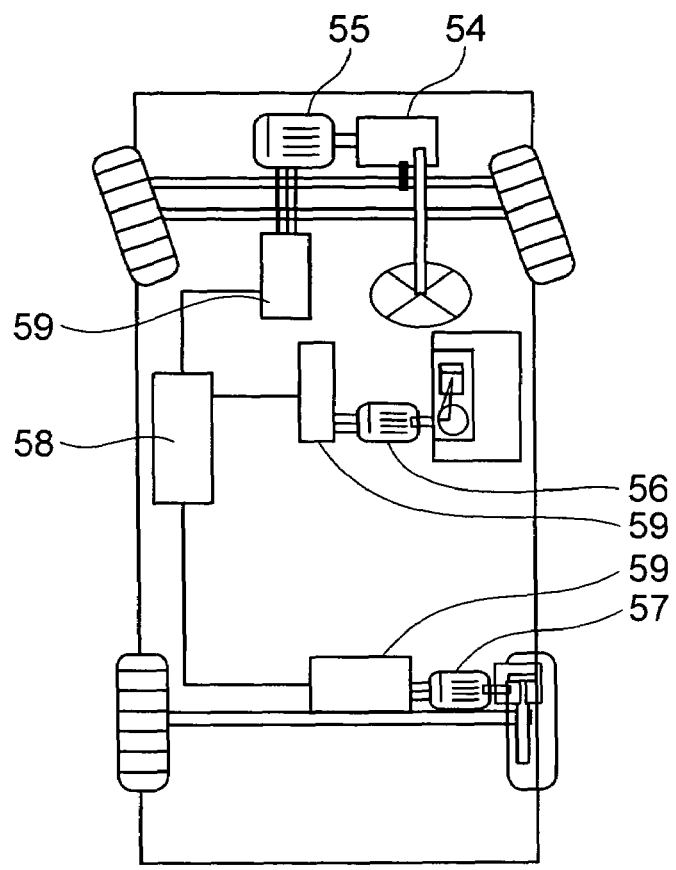
FIG. 30 is a view showing a construction of a motor drive system mounted on a vehicle and making use of the electric circuit module according to one of the 1st to 26th embodiments.

FIG. 30 shows a construction of a power conversion equipment 59, which is mounted on a mobile body and to which any one of the 1st to 26th embodiments of the electric circuit module described above is applied, and a load on the power conversion equipment 59, for example, a steering angle adjustment motor 55 of a steering device 54, a compressor drive motor 56 for air conditioners in a driver's cabin and a cargo chamber, and motor 57 for pressing of brake-pads in a brake caliper. With the power conversion equipment 59 mounted on the mobile body, DC electric power accumulated in a battery 58 is converted into AC electric power by the inverter unit 49 to be supplied to the respective motors. Since the inverter unit 49 is substantially the same in constitution as that in the power conversion equipment shown in FIG. 29, a detailed explanation therefor is omitted.

Since any one of the 1st to 26th embodiments of the electric circuit module described above, which is high in reliability, small in size, and low in cost, is used, it is possible to achieve making the power conversion equipment, which is mounted on the mobile body, small in size, low in cost, and high in reliability. In addition, while this example has been described making use of the battery 58 as a DC electric power supply, application to a system, in which fuel cells are used, and the like is also enabled.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electric circuit module comprising: an electric device comprising an electric circuit to serve for passage and interruption of electric current, a packing material packing the electric circuit and a plurality of wiring members to electrically connect the electric circuit with an external circuit; and a heat sink to radiate heat from the electric device, wherein the electric circuit module includes a fixture to fix the heat sink and the electric device together so that a heat radiating surface of the electric device comes into contact with the heat sink, the fixture is formed with a recess to accommodate therein a part of the electric device so that the heat radiating surface of the electric device is exposed from the fixture, whereby when the electric device is fixed to the heat sink by the fixture, the heat radiating surface comes into contact with the heat sink;

wherein the fixture includes an opening in the vicinity of the recess and the plurality of wiring members extend through the opening.

2. An electric circuit module according to claim 1, wherein the recess of the fixture accommodates therein a surface of the packing material opposite to the heat radiating surface and a part of the electric device.

3. An electric circuit module according to claim 1, wherein the heat sink is provided with a fitting portion adapted to fit with the fixture and the electric device is arranged between the fitting portion and a portion to which the fixture is fixed.

4. An electric circuit module according to claim 1, wherein a projection is provided on a surface of the fixture facing a surface of the packing material opposite to the radiating surface, said projection being adapted to come into contact with the packing material.

5. An electric circuit module according to claim 1, wherein a first projection and a second projection are provided on a surface of the fixture facing a surface of the packing material opposite to the radiating surface, the first projection is adapted to come into contact with a depression formed on the surface of the packing material and the second projection is adapted to fit in a hole provided in the packing material.

6. An electric circuit module according to claim 1, wherein a resin layer having a lower elasticity than those of the packing material and the fixture and a thermal conductivity is provided between the heat sink and the heat radiating surface.

7. An electric circuit module according to claim 1, wherein a resin layer having a lower elasticity than those of the packing material and the fixture and a thermal conductivity is provided between the heat sink and the heat radiating surface, and a silicone rubber layer having an stick property is provided on a side of the resin layer facing the heat radiating surface.

8. An electric circuit module according to claim 1, wherein a resin layer having a lower elasticity than those of the fixture and the packing material is provided on a surface of the fixture facing a surface of the packing material opposite to the heat radiating surface, and the resin layer and the packing material are in contact with each other.

9. An electric circuit module according to claim 1, wherein a resin layer having a lower elasticity than those of the fixture and the packing material is provided on a surface of the packing material opposite to the heat radiating surface, and the resin layer is in contact with the fixture.

10. An electric circuit module according to claim 1, wherein a resin sheet, which has a lower elasticity than those of the fixture and the packing material and includes an adhesive on one surface or both surfaces thereof, is arranged between the fixture and a surface of the packing material opposite to the heat radiating surface, and the electric device, the resin sheet and the fixture are fixed together.

11. An electric circuit module according to claim 1, wherein said fixture includes means for bonding to the electric device.

12. An electric circuit module according to claim 1, wherein the fixture comprises means for fixing a printed circuit board, to which the wiring members are connected.

13. An electric circuit module according to claim 1, further comprising a coming-off preventive member for preventing coming-off of the electric device from the fixture, the coming-off preventive member including concave-convex portions for fixing thereof to the fixture, and the fixture comprises concave-convex portions to engage with the concave-convex portions of the coming-off preventive member.

14. An electric circuit module according to claim 13, wherein the coming-off preventive member is arranged on a side of the fixture toward the heat sink, the lead wires are at a part thereof interposed between the coming-off preventive member and the fixture, the coming-off preventive member includes a slit-shaped wiring accommodating portion, and the wiring accommodating portion has function of accommodating a part of the lead wires and positioning the lead wires.

15. An electric circuit module according to claim 1, wherein the fixture is made of a resin having an insulating property, and the fixture comprises a terminal base for fixing and electrically connecting external wirings, through which an electric signal and electric power are input from and output to an external circuit.

16. An electric circuit module according to claim 1, wherein the fixture is made of a resin having an insulating property, a wiring member for detecting electric current is built in the fixture, and a magnetic sensor or a resistor is mounted to the wiring member for detecting electric current to provide for function of a current sensor.

17. An electric circuit module according to claim 1, wherein the fixture includes a concave-convex portion or a screw fitting portion for fixing a case to accommodate therein an electric system constituted with the use of the electric circuit module.

18. An electric circuit module according to claim 1, wherein a circuit for detecting temperature is built in the fixture, which faces a surface of the packing material opposite to the heat radiating surface.

19. An electric circuit module according to claim 1, wherein a circuit for detecting temperature of the heat sink is provided in the vicinity of the heat radiating surface of the electric device and on a side of the fixture toward the heat sink.

20. An electric circuit module according to claim 1, wherein intermediate connection wirings connected electrically to the plurality of wiring members of the electric device are built in the fixture, and the intermediate connection wirings are adapted to be connected to the printed circuit board or a circuit outside the electric circuit module.

* * * * *